(12) United States Patent
Chen (10) Patent No.: US 7,445,473 B2
(45) Date of Patent: Nov. 4, 2008

(54) MEMORY CARD CONNECTOR WITH IMPROVED FOLDABLE BAFFLER

(75) Inventor: You-Zhi Chen, Kunshan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/980,908

(22) Filed: Oct. 31, 2007

(65) Prior Publication Data

US 2008/0101004 A1    May 1, 2008

(51) Int. Cl.
  *H01R 13/44* (2006.01)
(52) U.S. Cl. .................... 439/138; 439/630; 439/607
(58) Field of Classification Search ............... 439/138, 439/142, 630, 607, 159
See application file for complete search history.

(56) References Cited

U.S. PATENT DOCUMENTS

| 6,120,322 | A | 9/2000 | Ho et al. |
| 6,269,005 | B1 | 7/2001 | Tung et al. |
| 6,887,087 | B2 | 5/2005 | Lai et al. |
| 7,097,475 | B2 * | 8/2006 | Cheng .................... 439/138 |
| 7,371,089 | B2 * | 5/2008 | Cheng .................... 439/159 |
| 7,374,439 | B2 * | 5/2008 | Kodama et al. ........... 439/138 |
| 2001/0049214 | A1 * | 12/2001 | Billman .................... 439/138 |
| 2004/0067667 | A1 * | 4/2004 | Kuroki .................... 439/138 |

FOREIGN PATENT DOCUMENTS

| CN | 2809952 Y | 8/2006 |
| CN | 2857254 Y | 1/2007 |
| TW | 279041 | 10/2005 |
| TW | 293561 | 7/2006 |
| TW | 296504 | 8/2006 |

* cited by examiner

*Primary Examiner*—Hien Vu
(74) *Attorney, Agent, or Firm*—Wei Te Chung (57) ABSTRACT

A memory card connector includes a metal cover defining a receiving space in which two different types of memory cards are insertable in an insertion direction through an insert opening generally at a rear end of the metal cover to respectively correspondingly connect with contacts mounted in a connector housing at a front end of metal cover. The metal cover further includes a pair of lateral walls spaced from each other in a direction transversely of the insertion direction, and a metal bracket with a U-shape configuration is assembled to the metal cover. And, a foldable baffler is mounted to the metal bracket.

10 Claims, 7 Drawing Sheets

MEMORY CARD CONNECTOR WITH IMPROVED FOLDABLE BAFFLER

BACKGROUND OF THE INVENTION

1. Field of the Invention

The present invention is directed to a memory card connector, and more specifically, to a memory card connector with improved foldable baffler.

2. Description of Related Arts

Memory cards are known in the art and contain intelligence in the form of a memory circuit or other electronic program. Some form of card reader reads the information or memory stored on the card. Such cards are used in many applications in today's electronic society, including video cameras, digital still cameras, smart phones, PDA's, music players, ATMs, cable television decoders, toys, games, PC adapters, multimedia cards and other electronic applications. Typically, a memory card includes a contact or terminal array for connection through a card connector to a card reader system and then to external equipment. The connector readily accommodates insertion and removal of the card to provide quick access to the information and program on the card. The card connector includes terminals for yieldingly engaging the contact array of the memory card.

In order to facilitate widespread use of memory cards, certain standards have been developed, for example the PCM-CIA (Personal Computer Memory Card International Association) standard that defines, inter alia, the connection interface and external dimensions of the cards. To this date, there are three standard PCMCIA cards, type 1, type 2 and type 3. The type 3 relates to Express Card, which is consisted of two-shape memory cards, a rectangular card, and a L-shape card. Accordingly, there are two shapes Express Card connectors to accommodate said two shape memory cards, wherein a L-shape connector can receive either said L-shape card or rectangular card, a rectangular connector only can receive a rectangular card.

A conventional L-shape express card connector, shown in TW Pat. No. 293561, which is published in Jul. 1, 2006 and assigned to Molex, includes a foldable baffler 51 installed at one lateral side of an insertion opening thereof. When a rectangular memory card is inserted into or pulled out from insertion opening, said foldable baffler cannot pivot inwardly along a traverse axis thereof, with a lateral side thereof being abutting against said rectangular memory card, for avoiding a deflection of card. When a L-shape memory card is inserted into said insertion opening, the foldable baffler can be pushed and pivoted inwardly along said axis for allowing the L-shape memory card to extend through. In this prior reference, for preventing the baffler from pivoting along said axis excessively, top and front plates 250, 251 are formed by a serial of complex processes. These spring plates are easy to distort and make an insertion of memory card inconveniently. And, setting two lateral plates 220 by stamping process make whole memory card connector complex and difficult to assembly. Similar structures are described in prior references, such as U.S. Pat. Nos. 6,887,087B2, 7,097,475B2, 6,120,322, and Chinese Pat. Pub. No. 2809952Y.

Hence, a memory card connector having improved foldable baffler is desired.

SUMMARY OF THE INVENTION

Accordingly, the object of the present invention is to provide a memory card connector with improved foldable baffler for preventing a memory card from deflection.

Another object of the present invention is to provide a memory card connector with improved foldable baffler, which is simple in structure and easy to assemble with a metal shell or a metal bracket.

A third object of the present invention is to provide a memory card connector, which can prevent a foldable baffler from pivoting excessively.

To achieve the above objects, a memory card connector in accordance with the present invention for respectively receiving two memory cards, a rectangular memory card and a L-shape memory card, comprises a metal cover defining a generally L-shaped receiving space for receiving two memory cards inserted into the receiving space in an insertion direction through an insert opening generally at a rear end of the metal cover, an insulative housing at a front end of the metal cover opposite to said inset opening, a plurality of contacts mounted in the insulative housing for connection to the memory cards, a metal bracket installed to the rear end of the metal cover and defining an opening opposite to the insulative housing in said insertion direction, and a foldable baffler mounted to the metal bracket. when the rectangular memory card is inserted into or pulled from the receiving space through said opening of the metal bracket, the rectangular memory card can be held by the foldable baffler for preventing deflection.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Referring to the drawings in greater detail, and first to FIGS. 1-7, the invention is embodied in a memory card connector with a generally L-shape configuration, generally designated 1, for receiving two memory cards, namely a rectangular memory card, generally designated 10, and a L-shape memory card, generally designated 11. The memory card connector 1 includes an insulative housing 2, which is mounted to a printed circuit board (not shown), a plurality of contacts 3, which is inserted into the housing 2, a metal cover 4, which is mounted to the housing 2, a guide rail 5, which is installed in the metal cover 4 for guiding insertions of two memory cards 10, 11. In addition, a metal bracket 7 is installed to the metal cover 4, and defines a pair of through holes 700 thereon, through which a foldable baffler 8 can fasten and pivot relative to the metal bracket 7, and a card-ejecting mechanism 6 is installed at a side of the metal cover 4, for ejecting two memory cards 10, 11 from the connector 1.

Figure 3:
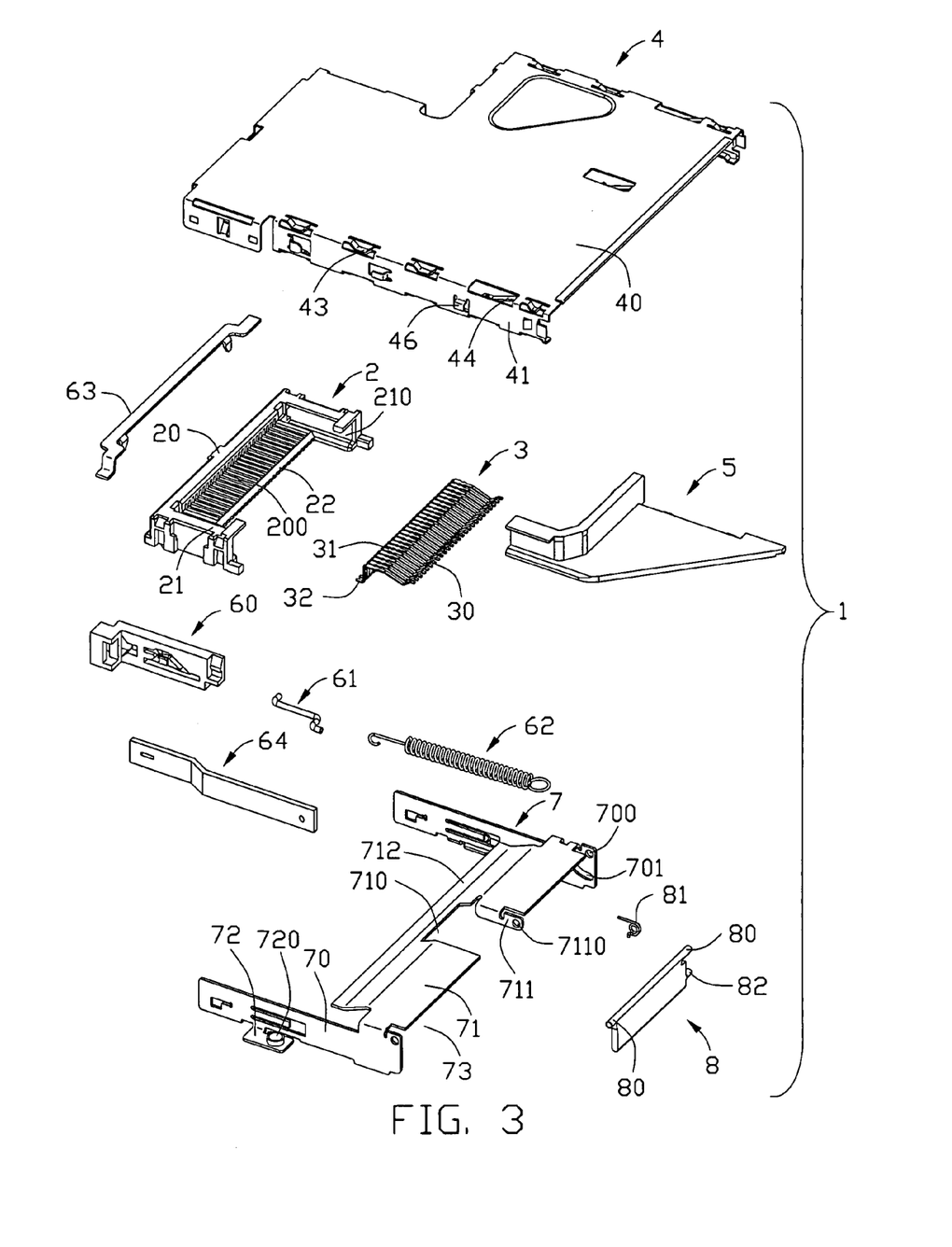
FIG. 3 is an exploded view of the memory card connector in according with the present invention.
Figure 4:
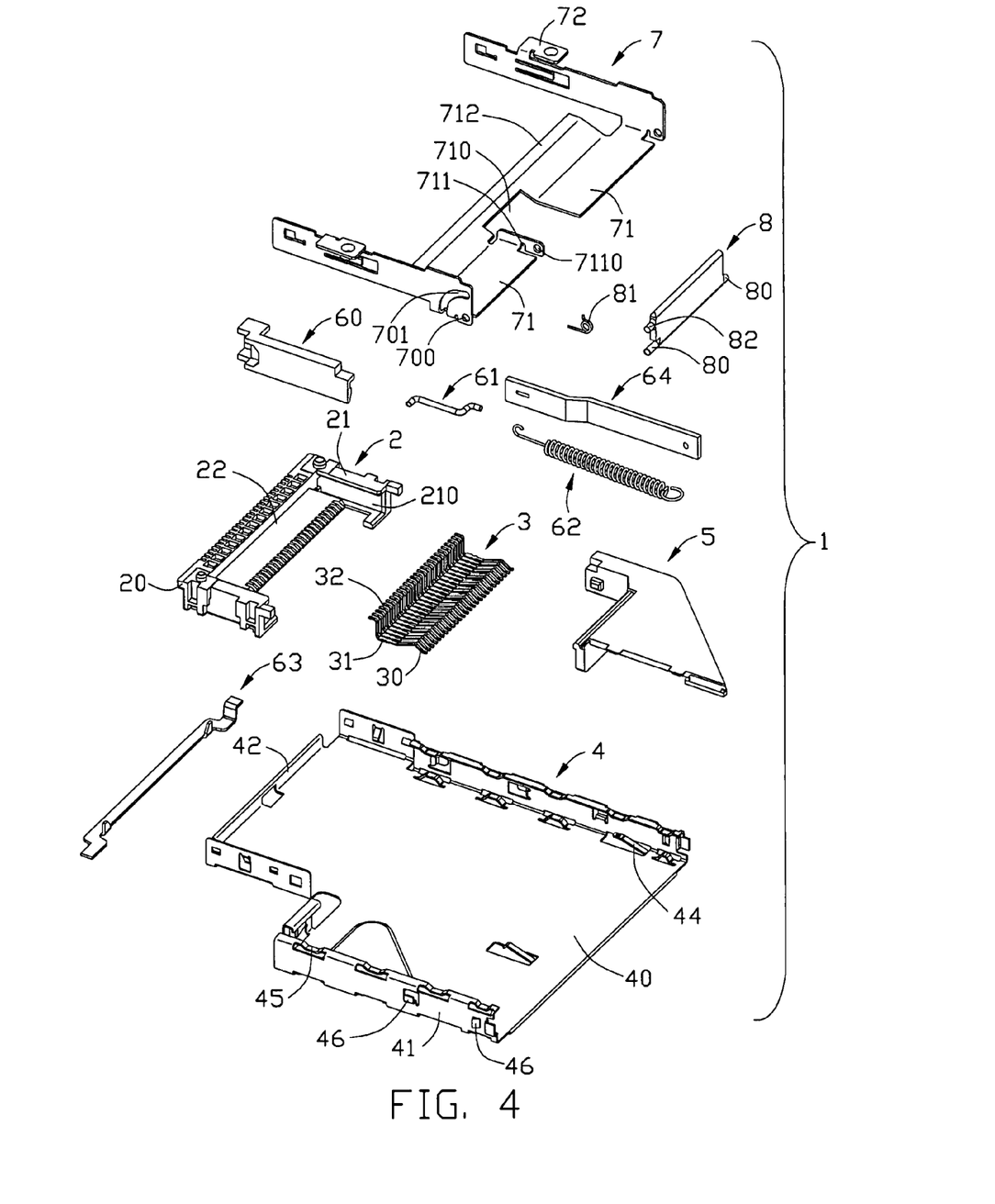
FIG. 4 is a view similar to FIG. 3, but taken from different aspect.

More particularly, with reference to FIGS. 3-4, the insulative housing 2 defines card insertion/ejecting directions which are opposite to each other. Along this card insertion/ejecting direction, two memory cards 10, 11 are inserted into or pulled from the connector 1. The housing 2 includes a traverse base section 20, a pair of arm section 21 rearwardly extending from two lateral sides of the base section 20, and a tongue section 22 located between two arm section 21 and extending from base section 20. A pair of guiding slots 210 is respectively defined in inner walls of arm section 21 for guiding insertions of memory cards 10, 11. A plurality of contact passageways 200 extends through base section 20 and tongue section 22 for receiving said contacts 3. The housing 2 is located at a front end of the metal cover 4.

Each contact 3 includes a mating end 30 received in tongue section 22 for electrically connection to memory cards 10, 11, a connecting portion 31 interferentially retained in contact passageways 200, a tail end 32 bent downwardly at a right-angle to connecting portion 32 for electrically connecting, as by soldering, to said printed circuit board.

The metal cover 4 is generally of a L-shape configuration for reason that its front end thereof is narrower than its rear end thereof, and covers on the housing 2. This cover 4 includes an upper wall 40, a pair of lateral walls 41 bent downwardly from lateral edges of the lower wall 40, and a front wall 42 bent downwardly from a front edge of the upper wall 40, these walls together define a receiving space (not labeled) and an insert opening (not labeled) generally at a rear end of the metal cover 4. Two memory cards 10, 11 are inserted into the receiving space in said card insertion direction through insert opening. The upper wall 40 with a L-shape configuration, defines a plurality of protrusion 43 formed at lateral edges thereof, and projecting toward the receiving space, and two spring 44 respectively arrayed in a line with lateral protrusions 43. Similarly, the lateral walls 41 bent inwardly to form a pair of short pieces (not labeled), and a plurality of protrusion 45 formed at two short pieces and arrayed in a line. These protrusion 43, 45 and springs 44 together define a pair of guiding slots (not labeled) for guide insertions of memory cards 10, 11. Referring to FIGS. 3-4, a left lateral wall 41 is longer than the other right lateral wall 41 and includes a plurality of locking bar 46 for engaging with the metal bracket 7.

Figure 5:
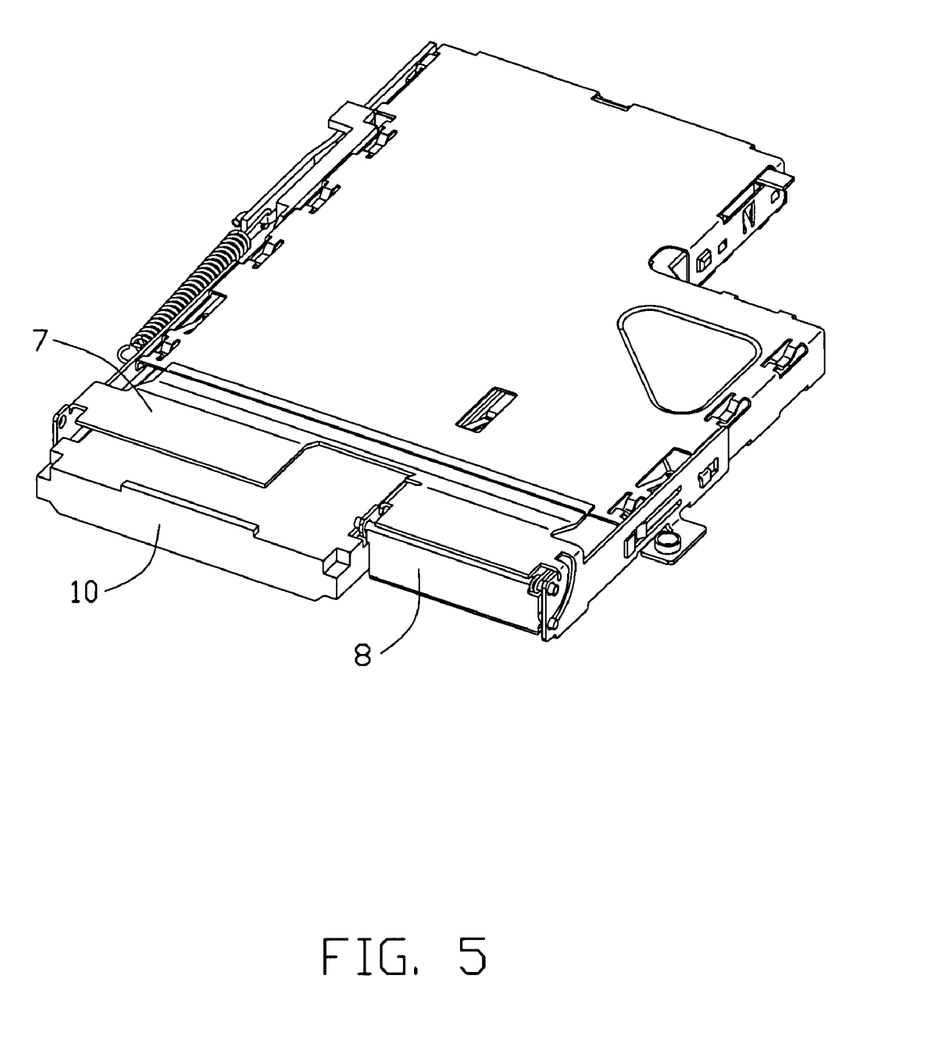
FIG. 5 is a perspective, assembled view of the memory card connector, with a rectangular memory card inserted therein.
Figure 6:
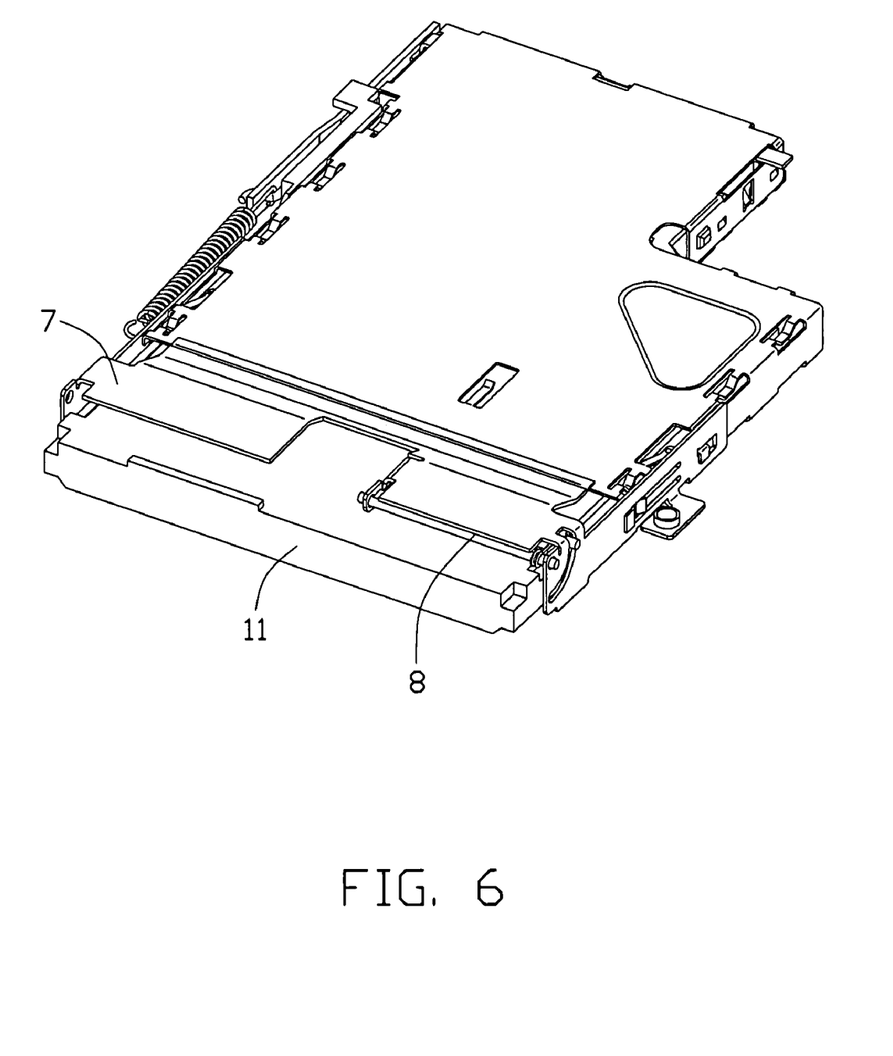
FIG. 6 is a perspective, assembled view of the memory card connector, with a L-shape memory card connector inserted therein.
Figure 7:
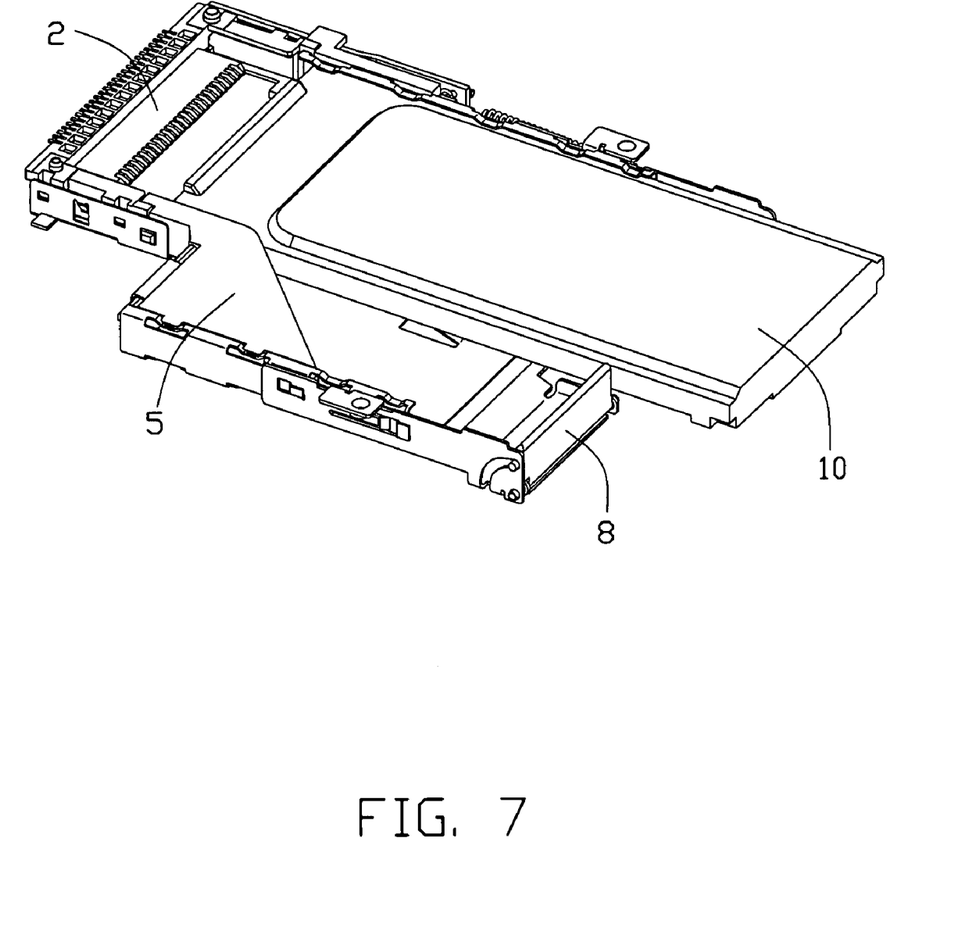
FIG. 7 is a similar view of FIG. 2, wherein a rectangular memory card is inserted into the memory card connector.

Referring to FIGS. 4-6, card-ejecting mechanism 6 is installed at a side of metal cover 4, and includes a base section 60 installed on the metal cover 4, a cam follower 61 circularly moving in circular slot (not labeled) formed at base section 60, a spring 62 locking with the cam follower 61 and the metal bracket 7, a metal slider 64 extending through the base section 60 and driving the cam follower 61 to move circularly and synchronously, and an ejecting bar 63 with one thereof engaging with the metal slider 64 for pushing the memory cards 10, 11 out from the connector 1. Detailed description on work process and assembly of this push-push type card-ejecting mechanism 6 omits thereafter, for it is obvious to an ordinary skilled person in this art.

Referring to FIGS. 3-4, the metal bracket 7, installed at the insert opening of metal cover 4, includes a traverse piece 71, and a pair of lateral arm pieces 70 bent downwardly at a right angle to traverse piece 71 and extending forwardly from two lateral edges of the traverse piece 71. A pair of mounting ears 72 projecting outwardly and laterally from lower edges of arm pieces 70, with a through hole 720 therein for allowing screws (not shown) to extend through and fix the metal bracket 7 to said printed circuit board. And, each lateral arm pieces 70 has several locking apertures (now labeled) for engaging with corresponding locking bars (now labeled), and resultantly causing a reliable connection between metal cover 4 and metal bracket 7. In this preferred embodiment, the pair of lateral arm pieces 70 is respectively located at outsides of the lateral walls 41 and engaged therewith.

Each arm piece 70 includes a pivot hole 700, these two pivot holes 700 are opposite to each other, and in a liner array. In addition, one arm piece 70, located at a similar side as a short lateral wall 41, further has an arc slot 701 with a central angle of ninety degrees generally. The metal bracket 7 also includes a cantilevered spring 712, which extends forwardly and downwardly from an inner edge of the traverse piece 71 and locates between two arm pieces 70, and an aperture 710 defined generally at middle thereof along a traverse direction. The cantilevered spring 712 is shorter than the traverse piece 71 along the traverse direction. An inner arm 711 is bent downwardly at a right angle relative to the traverse piece 71, and has a pivot hole 7110 in said liner array. Noticeably, said liner array defined by linking pivot hole 700 defined adjacent to the arc slot 701, pivot hole 7110 is regarded as "traverse axis", by which the foldable baffler 8 pivots in a boundary of central angle defined by arc slot 701. The cantilevered spring 712 extends toward the receiving space of the metal shell 4 with tip thereof being located below the upper wall 40 for guiding insertions of the memory cards 10, 11. At a rear of the metal bracket 7, there also has a card insert opening (not labeled) which is adjacent to the insert opening of the metal shell 4 for allowing the memory cards to extend through.

The foldable baffler 8 is installed to the metal bracket 7, and located adjacent to the card insert opening defined by the metal bracket 7. The foldable baffler 8 with a traverse dimension that is generally equal to interval between two pivot holes 700, 7110 (shown in FIG. 3). Two pivot pins 80 formed at two tips of the baffler 8, are respectively received in pivot holes 700, 7110 as seen in FIG. 3, for fixing the baffler 8 at the metal bracket 7. A third pivot pin 82 is received in arc slot 701 for allowing a pivot of the baffler 8. For reason of close arc slot 701, the foldable baffler 8 can only turn inwardly to close the traverse piece 71, and cannot turn outwardly. Between an arm piece 70 and the inner arm 711, there has an opening where the rectangular memory card can extend through and into the receiving space and be hold by the foldable baffler 8 for preventing deflection. Between the other arm piece 70 and the inner arm 711, an opening is shielded by the foldable baffler 8 for its own weight after the foldable baffler 8 is installed to the metal bracket 7. In addition, for preventing the foldable baffler 8 from shaking before the L-shape memory card 11 is pushed into the receiving space of the connector 1, the metal bracket 7 has a spring 81, which is installed to one pivot pin 80 with one arm thereof abutting against the traverse piece 70, and the other arm abutting against the foldable baffler 8.

Figure 1:
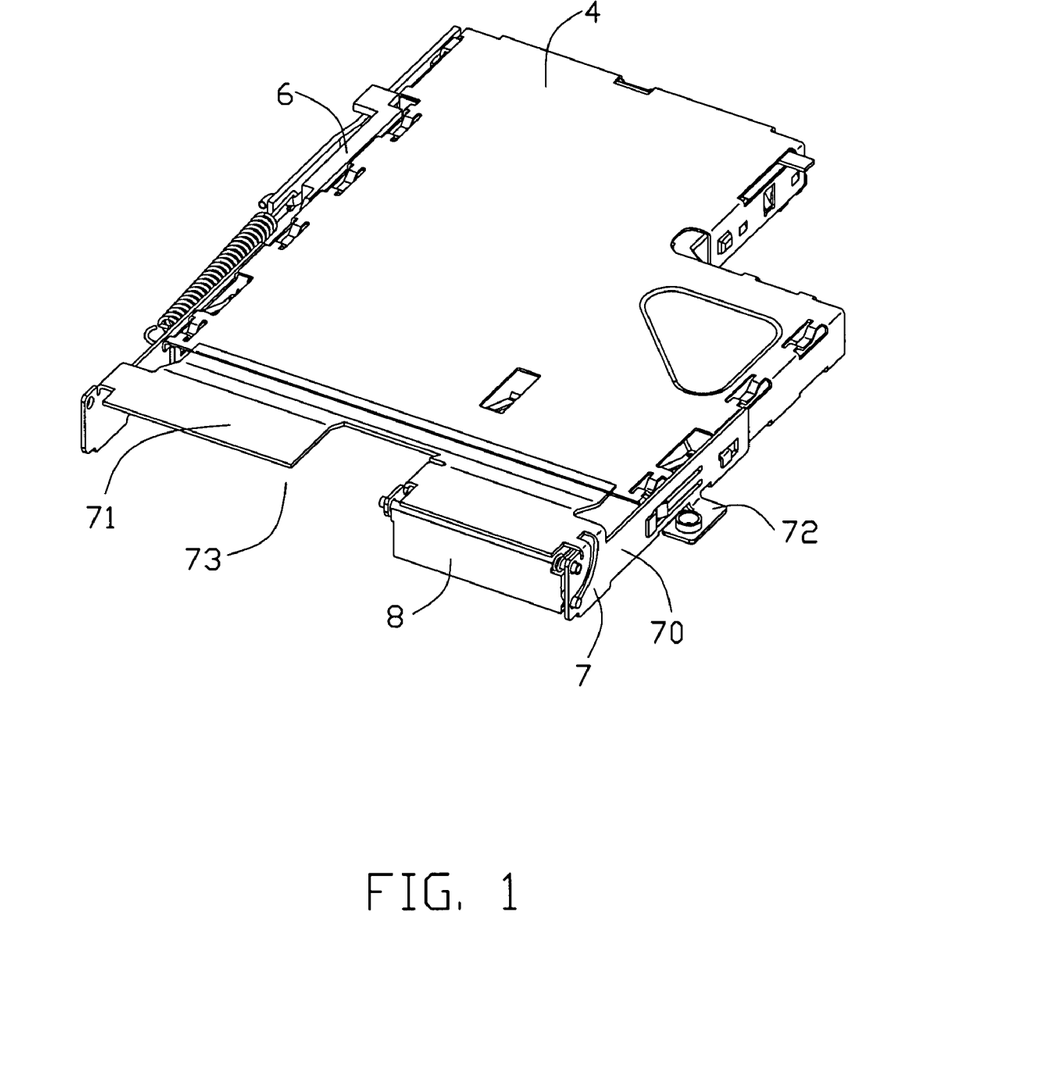
FIG. 1 is a perspective, assembled view of a memory card connector in accordance with the present invention.
Figure 2:
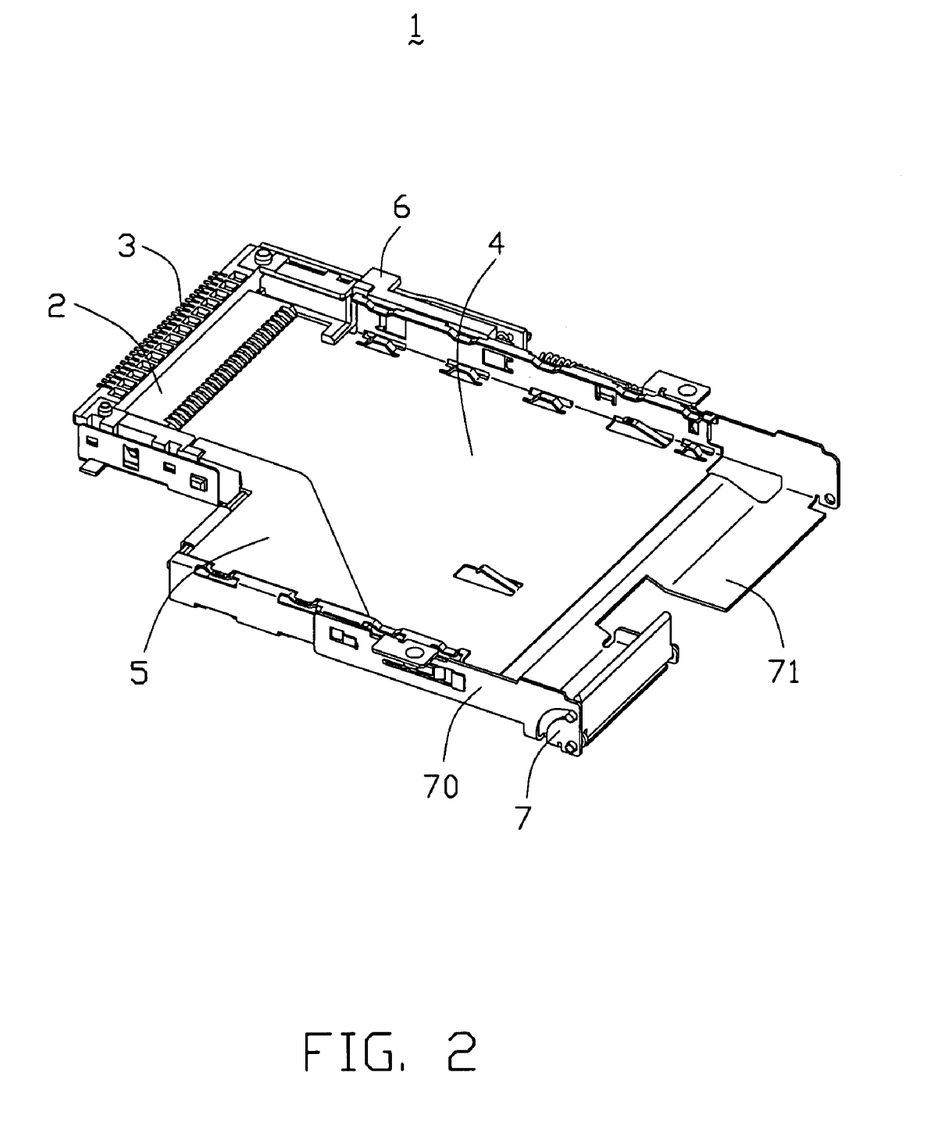
FIG. 2 is a view similar to FIG. 1, but taken from different aspect.

Referring to FIGS. 1-7, when the rectangular memory card 10 is inserted into or pulled from the receiving space of connector 1 through an opening 73 of the metal bracket 7, the rectangular memory card 10 cannot deviate from its normal trace for two lateral sides thereof being restrictively abutted by the foldable baffler 8 and the metal bracket 7. Referring to FIG. 6, when the L-shape memory card 11 is inserted into the receiving space of connector 1, the foldable baffler 8 will be pushed by memory card 11 and pivot inwardly to close the traverse piece 71 along said traverse axis. And, when L-shape memory card 11 is pulled out, the foldable baffler 8 will move back to initial position by its own weight and restored force of the spring 81. Referring to FIG. 2, the traverse piece 71 is higher than the arm piece 70, and defines interval between an upper surface of the traverse piece 71 and a top edge of the arm piece 70 with a height being generally equal to thickness of foldable baffler 8. So, the memory card 11 won't be barred by foldable baffler 8 since the baffler 8 can be pushed and locate in said interval. Noticeably, the opening 73 of the metal bracket 7 is opposite to the insulative housing 2 along the card insertion direction.

In addition, in another preferred embodiment, the metal bracket 7 and metal cover 4 are unitarily stamped by one piece metal strip, and do not need to assemble them as illustrated in above preferred embodiment. In this embodiment, the arm pieces 70 of the metal bracket 7 are integrally shaped as part of the metal shell 4 and extend from the lateral walls 41. The cantilevered spring 712 extends from a rear edge of the upper wall 40 and is bent upwardly. Different from Taiwan Pat. No. 293561, the traverse piece 70 in instant invention, extending along a whole traverse direction of the metal shell 4, is higher than the upper wall 40 of the metal shell 4, and the cantilevered spring 712 extends downwardly from inner edge of the traverse piece 70, and is shaped as a slope for guiding insertions of the memory cards 10, 11. In addition, because card insert opening is large, for reason of a higher height of the traverse piece, to allow the memory cards 10, 11 to extend through, the memory cards 10, 11 won't be scraped by the metal, and can be pushed into the receiving space easily.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed. For example, another baffle can be installed beside the current baffle to commonly shield the card receiving space for dust-proof consideration so that such another baffle will be lifted during insertion of the rectangular card while both baffles will be lifted during insertion of the L-shaped card.

I claim:

1. A memory card connector for respectively receiving two memory cards, a rectangular memory card and a L-shape memory card, comprising:
   a metal cover defining a generally L-shaped receiving space for receiving two memory cards inserted into the receiving space in an insertion direction through an insert opening generally at a rear end of the metal cover;
   an insulative housing at a front end of the metal cover opposite to said insert opening;
   a plurality of contacts mounted in the insulative housing for connection to the memory cards;
   a metal bracket installed to the rear end of the metal cover and defining an opening opposite to the insulative housing in said insertion direction; and
   a foldable baffler mounted to the metal bracket, when the rectangular memory card is inserted into or pulled from the receiving space through said opening of the metal bracket, the rectangular memory card can be held by the foldable baffler for preventing deflection;
   wherein the metal bracket with a generally U-shape, has a traverse piece, and a pair of arm pieces forwardly extending from the traverse piece and engaged with metal cover, wherein the traverse piece is higher than the metal cover;
   wherein the traverse piece defines an aperture generally at a middle thereof, and an inner arm bent downwardly and within the aperture, wherein the foldable baffler is mounted to the bracket with one pivot pin thereof engaging with a pivot hole of the inner arm, and the other pivot pin thereof engaging with another pivot hole of one of the arm pieces of the metal bracket;
   wherein the metal bracket further has a cantilevered spring extending downwardly and forwardly from an inner edge of the traverse piece and with a tip end thereof located below an upper wall of the metal cover; and
   wherein the arm pieces of the metal bracket, and the inner arm are generally perpendicular to the traverse piece, and the inner arm extends downwardly a distance which is shorter than that of the other two arm pieces.

2. The memory card connector as described in claim 1, wherein the foldable baffler pivots toward the receiving space along a traverse axis defined by the metal bracket when said L-shaped memory card is inserted into the receiving space, and moves back to initial position by its own weight when said L-shaped memory card is pulled out from the connector.

3. The memory card connector as described in claim 1, wherein one of arm piece defines a close arc slot with a central angle generally of ninety degrees, the foldable baffler has a pivot pin moveably received in the close arc slot for providing a movement boundary of the foldable baffler.

4. The memory card connector as described in claim 1, wherein the traverse piece extends along a whole length of the metal cover along a direction perpendicular to the insertion direction.

5. The memory card connector as described in claim 1, wherein the cantilevered spring is shorter than the traverse piece along a direction perpendicular to the insertion direction.

6. The memory card connector as described in claim 1, wherein said opening of the metal bracket is defined between the inner arm and one of the arm pieces of the metal bracket, said one of the arm pieces is far away from the foldable baffler.

7. A memory card connector for receiving two different types memory cards, comprising:
   a metal cover defining a receiving space in which two different types of memory cards are insertable in an insertion direction through an insert opening generally at a rear end of the metal cover to respectively correspondingly connect with contacts mounted in a connector housing at a front end of metal cover; wherein
   said metal cover further includes an upper wall, a pair of lateral walls spaced from each other in a direction transversely of said insertion direction, a U-shaped metal bracket installed to the rear end of the metal cover housing and a traverse piece at a rear end thereof and generally parallel to the upper wall; wherein
   said traverse piece has an inner arm which is spaced from two lateral walls and located therebetween, a foldable baffler is mounted to the inner arm and one of the lateral wall; wherein
   said card connector further defines an opening located a side of the foldable baffler and opposite to the connector housing, when a memory card is inserted into the receiving space through the opening, this memory card can be restrictively held by foldable baffler for avoiding deflection thereof;
   wherein the traverse piece extends along a whole length between the pair of lateral walls and is higher than the upper wall of the metal cover,
   wherein the traverse piece defines an aperture generally at a middle thereof, and an inner arm bent downwardly and within the aperture, wherein the foldable baffler is mounted to the bracket with one pivot pin thereof engaging with a pivot hole of the inner arm, and the other pivot pin thereof engaging with another pivot hole of one of the arm pieces of the metal bracket;

wherein the connector further includes a spring which extends forwardly and downwardly from an edge of the traverse piece to located below the upper wall or integrally shape as part of the upper wall; and wherein one of said lateral walls includes a close arc slot, the foldable baffler has a pivot pin received in and moving along said close arc slot, for limiting pivotable range thereof.

8. The memory card connector as described in claim 7, wherein the front end of said metal cover is narrower than the rear end thereof whereby said receiving space is generally L-shaped in a horizontal plane.

9. The memory card connector as described in claim 7, wherein said foldable baffler pivots toward the receiving space along a traverse axis when the other type memory card is inserted into the receiving space, and moves back to initial position by its own weight when the other type memory card is pulled out from the connector.

10. The memory card connector as described in claim 7, wherein one of said two different types memory cards is of a rectangular configuration, and the other is of a L-shape.

* * * * *